(12) United States Patent
Ryu et al.

(10) Patent No.: US 11,810,494 B2
(45) Date of Patent: Nov. 7, 2023

(54) DITHER ENHANCEMENT OF DISPLAY GAMMA DAC SYSTEMS AND METHODS

(71) Applicant: Apple Inc., Cupertino, CA (US)

(72) Inventors: Jie Won Ryu, Santa Clara, CA (US); ByoungSuk Kim, Palo Alto, CA (US); David S Zalatimo, San Jose, CA (US); Graeme M Williams, San Diego, CA (US); Hyunsoo Kim, San Diego, CA (US); Hyunwoo Nho, Palo Alto, CA (US); Jesse R Manders, San Francisco, CA (US); Kingsuk Brahma, Mountain View, CA (US); Li-Xuan Chuo, San Jose, CA (US); Sachiko Oda, Santa Clara, CA (US); Shatam Agarwal, San Jose, CA (US); Yao Shi, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/820,190

(22) Filed: Aug. 16, 2022

(65) Prior Publication Data
US 2023/0087480 A1  Mar. 23, 2023

Related U.S. Application Data (60) Provisional application No. 63/247,165, filed on Sep. 22, 2021.

(51) Int. Cl.
*G09G 3/20* (2006.01)
*H03M 1/10* (2006.01)

(52) U.S. Cl.
CPC ........ *G09G 3/2044* (2013.01); *H03M 1/1019* (2013.01); *G09G 2310/027* (2013.01); *G09G 2320/0276* (2013.01)

(58) Field of Classification Search
CPC ..... G09G 2320/0276; G09G 2310/027; G09G 3/2044; G09G 3/2051; H03M 1/1019
See application file for complete search history.

(56) References Cited

U.S. PATENT DOCUMENTS

2002/0075215 A1\* 6/2002 Willis ...................... G09G 3/20
                                                            345/89
2006/0114205 A1\* 6/2006 Shen .................... G09G 3/3688
                                                            345/88

(Continued)

FOREIGN PATENT DOCUMENTS

CN          103315330       \*   9/2013   .............. H04N 5/20
CN          105164996       \*   6/2018   ............. H04N 19/90

*Primary Examiner* — Matthew A Eason
*Assistant Examiner* — Scott D Au
(74) *Attorney, Agent, or Firm* — Fletcher Yoder P.C.

(57) ABSTRACT

An electronic device may include an electronic display having multiple display pixels to display an image based on analog voltage signals. The electronic device may also include optical calibration circuitry to generate digital-to-analog converter (DAC) data based on image data associated with the image and dither circuitry to reduce a bit-depth of the DAC data, generating dithered DAC data. Additionally, the electronic device may include a gamma generator having one or more DACs to generate the analog voltage signals based on the dithered DAC data, which may instruct the gamma generator to generate the analog voltage signals indicative of the image data.

20 Claims, 9 Drawing Sheets

(56) References Cited

U.S. PATENT DOCUMENTS

2019/0180695 A1\* 6/2019 Ha .................. G09G 3/3266
2020/0279520 A1\* 9/2020 Senda .............. H04N 9/3182
2020/0372867 A1 11/2020 Chen et al.
2021/0056930 A1 2/2021 Kang et al.

\* cited by examiner

DITHER ENHANCEMENT OF DISPLAY GAMMA DAC SYSTEMS AND METHODS

CROSS-REFERENCE TO RELATED APPLICATIONS

This application claims priority to U.S. Provisional Application No. 63/247,165, filed Sep. 22, 2021, entitled "DITHER ENHANCEMENT OF DISPLAY GAMMA DAC SYSTEMS AND METHODS," the disclosure of which is incorporated by reference in its entirety for all purposes.

SUMMARY

This disclosure relates to interpolation systems and methods for enhancing the effective resolution (e.g., bit-depth) of a gamma digital-to-analog converter (DAC).

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In general, image data may be processed (e.g., by image processing circuitry) in gray code for image enhancement, display or environmental compensations, and/or other image processing techniques before being converted to analog voltages to drive display pixels. Between image processing and converting the processed image data to analog voltages, the processed image data may be transformed from a gray code format to a DAC code format. For example, optical calibration transformation circuitry may use a look-up table (LUT) to transform the processed image data to DAC data, having a DAC code format, to be used by one or more DACs in the gamma generator to generate the analog voltages that drive the display pixels. Moreover, in some embodiments, the DAC code may be specific to the type and/or model of electronic display.

In some scenarios, the processed image data and/or DAC data may have a higher resolution (e.g., bit-depth) than the gamma generator input. As such, DAC dither circuitry may dither the DAC data in the DAC code domain prior to the gamma generator to reduce the bit-depth into the gamma generator, but maintain effective resolution. For example, the DAC dither circuitry may dither the DAC data spatially, temporally, or spatiotemporally such that, when displayed via the pixels, the perceived spatial, temporal, or spatiotemporal average appears as having the higher resolution of the DAC data.

By dithering the DAC data in the DAC code domain the effective resolution of the gamma generator may be increased. As such, a gamma generator having a reduced (relative to the transformed DAC data) working bit-depth may be used while maintaining the higher perceived (e.g., effective) resolution. Additionally, a lower bit-depth gamma generator may be more cost and resource efficient during manufacturing and/or have a decreased footprint within the electronic device, saving space and/or reducing the size of the electronic device. Moreover, reducing the bit-depth of the DAC data (e.g., to that of dithered DAC data) may also decrease the footprint of the data lines (e.g., gamma bus) carrying the dithered DAC data and/or analog voltages, further saving space and/or manufacturing resources.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

Electronic devices such as computers, mobile phones, portable media devices, tablets, televisions, virtual-reality headsets, and vehicle dashboards, among many others, often use one or more electronic displays to present information via one or more images (e.g., image frames). Such electronic displays may take the form of a liquid crystal display (LCD), a light emitting diode (LED) display, an organic light emitting diode (OLED) display, a plasma display, or the like. In any case, to display an image, the electronic display generally controls light emission (e.g., luminance and/or color) of its display pixels based on corresponding image data. For example, an image data source (e.g., memory, an input/output (I/O) port, and/or a communication network) may output image data as a stream of pixel data that indicates target luminance of display pixels located at a corresponding pixel positions. Furthermore, digital values of the image data may be mapped to analog voltages to drive each of the display pixels at a target luminance level.

In some embodiments, image data may indicate the target luminance per color component (e.g., a gray level for each color component), for example, via red component image data, blue component image data, and green component image data. In general, while the image data may be used in any of a number of different color spaces (e.g., RGB, sRGB, YCbCr, YUV, HSV, HSL, RGBA, etc.), as used herein, the values of the gray levels for each component are considered as being in gray code. Additionally, the image data may be processed (e.g., by image processing circuitry) in gray code for image enhancement, display or environmental compensations, and/or other image processing techniques.

To facilitate displaying the image data, analog voltages may be supplied by a gamma generator to drivers of display pixels at various analog voltage levels to achieve the desired luminance values (e.g., gray levels for each color component). For example, in some embodiments, the different voltage levels may be achieved via one or more digital to analog converters (DACs), amplifiers, and/or resistor strings. In some embodiments, the gamma generator may output multiple different voltage levels corresponding to the digital values of the image data. For example, 8-bit image data per color component may correspond to a gamut of 256 different gray levels and, therefore, 256 different voltage levels per color component. As should be appreciated, the image data and corresponding voltage outputs may be associated with any suitable bit-depth and gray level values depending on implementation and the electronic display. Furthermore, the gamma generator may include more or fewer voltage outputs than the corresponding bit-depth of image data. For example, in some embodiments, the same voltage level may be used for multiple gray levels, and the current may be pulse-width modulated to obtain the different perceived luminance outputs.

Current may be supplied to the display pixels at various voltage levels generated by the gamma generator to achieve the desired luminance values (e.g., gray levels for each color component). In some scenarios, pixels of different electronic displays may use different voltage levels/currents to output the same gray levels. As such, between image processing and converting the processed image data to analog voltages, the processed image data may be transformed from a gray code format to a DAC code format. For example, optical calibration transformation circuitry may use a look-up table (LUT) to transform the processed image data to DAC data, having a DAC code format, to be used by one or more DACs in the gamma generator. Moreover, in some embodiments, the DAC code may be specific to the type and/or model of electronic display.

In some scenarios, the processed image data and/or DAC data may have a higher resolution (e.g., bit-depth) than the gamma generator input. As such, DAC dither circuitry may dither the DAC data in the DAC code domain prior to the gamma generator to reduce the bit-depth into the gamma generator, but maintain effective resolution. For example, the DAC dither circuitry may dither the DAC data spatially, temporally, or spatiotemporally such that, when displayed via the pixels, the perceived spatial, temporal, or spatiotemporal average appears as having the higher resolution of the DAC data.

By dithering the DAC data in the DAC code domain the effective resolution of the gamma generator may be increased. As such, a gamma generator having a reduced (relative to the transformed DAC data) working bit-depth may be used while maintaining the higher perceived (e.g., effective) resolution. Additionally, a lower bit-depth gamma generator may be more cost and resource efficient during manufacturing and/or have a decreased footprint within the electronic device, saving space and/or reducing the size of the electronic device. Moreover, reducing the bit-depth of the DAC data (e.g., to that of dithered DAC data) may also decrease the footprint of the data lines (e.g., gamma bus) carrying the dithered DAC data and/or analog voltages, further saving space and/or manufacturing resources.

Figure 1:
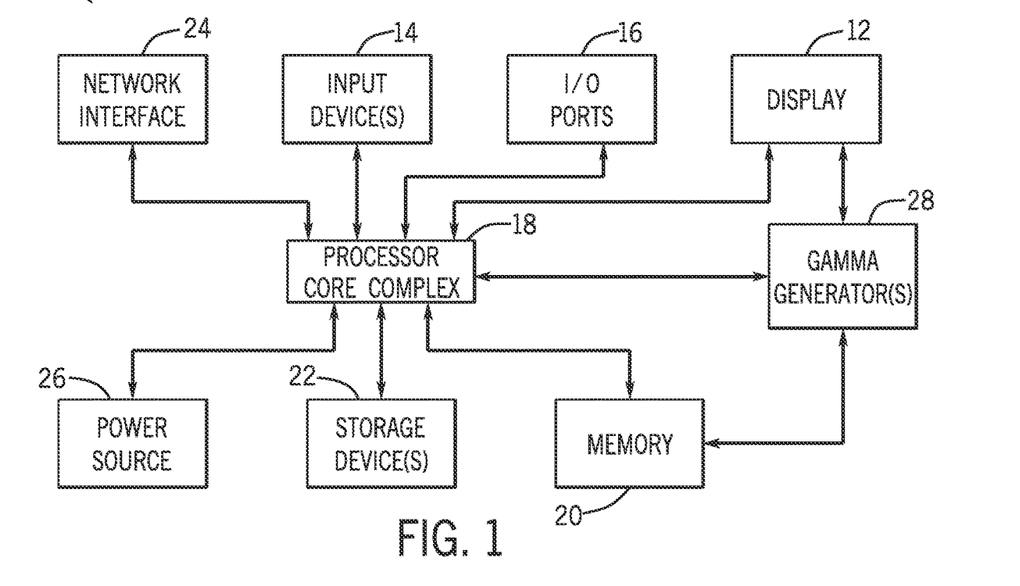
FIG. 1 is a block diagram of an electronic device that includes an electronic display, in accordance with an embodiment.

One embodiment of an electronic device 10 that may use DAC dither circuitry to dither DAC data prior to a gamma generator is shown in FIG. 1. As will be described in more detail below, the electronic device 10 may be any suitable electronic device, such as a handheld electronic device, a tablet electronic device, a notebook computer, and the like. Thus, it should be noted that FIG. 1 is merely one example of a particular implementation and is intended to illustrate the types of components that may be present in the electronic device 10.

The electronic device 10 may include one or more electronic displays 12, input devices 14, input/output (I/O) ports 16, a processor core complex 18 having one or more processors or processor cores, local memory 20, a main memory storage device 22, a network interface 24, a power source 26, and one or more gamma generators 28. The various components described in FIG. 1 may include hardware elements (e.g., circuitry), software elements (e.g., a tangible, non-transitory computer-readable medium storing instructions), or a combination of both hardware and software elements. As should be appreciated, the various components may be combined into fewer components or separated into additional components. For example, the local memory 20 and the main memory storage device 22 may be included in a single component. Additionally, the gamma generator 28 may be included in the electronic display 12, such as part of a display driver or a timing controller (TCON), or implemented separately.

The processor core complex 18 may be operably coupled with local memory 20 and the main memory storage device 22. The local memory 20 and/or the main memory storage device 22 may include tangible, non-transitory, computer-readable media that store instructions executable by the processor core complex 18 and/or data to be processed by the processor core complex 18. For example, the local memory 20 may include cache memory or random access memory (RAM) and the main memory storage device 22 may include read only memory (ROM), rewritable non-volatile memory such as flash memory, hard drives, optical discs, and/or the like.

The processor core complex 18 may execute instructions stored in local memory 20 and/or the main memory storage device 22 to perform operations, such as generating source image data. As such, the processor core complex 18 may include one or more general purpose microprocessors, one or more application specific processors (ASICs), one or more field programmable logic arrays (FPGAs), or any combination thereof.

The network interface 24 may connect the electronic device 10 to a personal area network (PAN), such as a Bluetooth network, a local area network (LAN), such as an 802.11x Wi-Fi network, and/or a wide area network (WAN), such as a 4G, LTE, or 5G cellular network. In this manner, the network interface 24 may enable the electronic device 10 to transmit image data to a network and/or receive image data from the network.

The power source 26 may provide electrical power to one or more components in the electronic device 10, such as the processor core complex 18, the electronic display 12, and/or the gamma generator 28. Thus, the power source 26 may include any suitable source of energy, such as a rechargeable lithium polymer (Li-poly) battery and/or an alternating current (AC) power converter.

The I/O ports 16 may enable the electronic device 10 to interface with various other electronic devices. The input devices 14 may enable a user to interact with the electronic device 10. For example, the input devices 14 may include buttons, keyboards, mice, trackpads, and the like. Additionally or alternatively, the electronic display 12 may include touch sensing components that enable user inputs to the electronic device 10 by detecting occurrence and/or position of an object touching its screen (e.g., surface of the electronic display 12).

The electronic display 12 may display a graphical user interface (GUI) of an operating system, an application interface, text, a still image, or video content. To facilitate displaying images, the electronic display 12 may include a display panel with one or more display pixels. Additionally, each display pixel may include one or more sub-pixels, which each control the luminance of a color component (e.g., red, green, or blue). As used herein, a display pixel may refer to a collection of sub-pixels (e.g., red, green, and blue subpixels) or may refer to a single sub-pixel.

As described above, the electronic display 12 may display an image by controlling the luminance of the sub-pixels based at least in part on corresponding image data. In some embodiments, the image data may be received from another electronic device, for example, via the network interface 24 and/or the I/O ports 16. Additionally or alternatively, the image data may be generated by the processor core complex 18 and/or image processing circuitry, discussed further below. Moreover, in some embodiments, the electronic device 10 may include multiple electronic displays 12 and/or may perform image processing for one or more external electronic displays 12, such as connected via the network interface 24 and/or the I/O ports 16.

Figure 2:
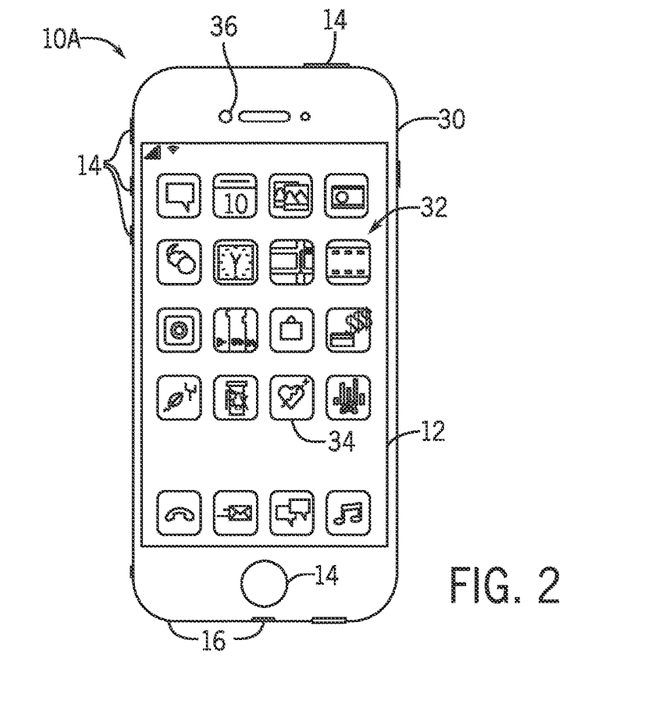
FIG. 2 is an example of the electronic device of FIG. 1, in accordance with an embodiment.

The electronic device 10 may be any suitable electronic device. To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For example, the handheld device 10A may be a smart phone, such as an iPhone® model available from Apple Inc.

The handheld device 10A may include an enclosure 30 (e.g., housing) to, for example, protect interior components from physical damage and/or shield them from electromagnetic interference. Additionally, the enclosure 30 may surround, at least partially, the electronic display 12. In the depicted embodiment, the electronic display 12 is displaying a graphical user interface (GUI) 32 having an array of icons 34. By way of example, when an icon 34 is selected either by an input device 14 or a touch-sensing component of the electronic display 12, an application program may launch.

Furthermore, input devices 14 may be provided through openings in the enclosure 30. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. Moreover, the I/O ports 16 may also open through the enclosure 30. Additionally, the electronic device may include one or more cameras 36 to capture pictures or video. In some embodiments, a camera 36 may be used in conjunction with a virtual reality or augmented reality visualization on the electronic display 12.

Figure 3:
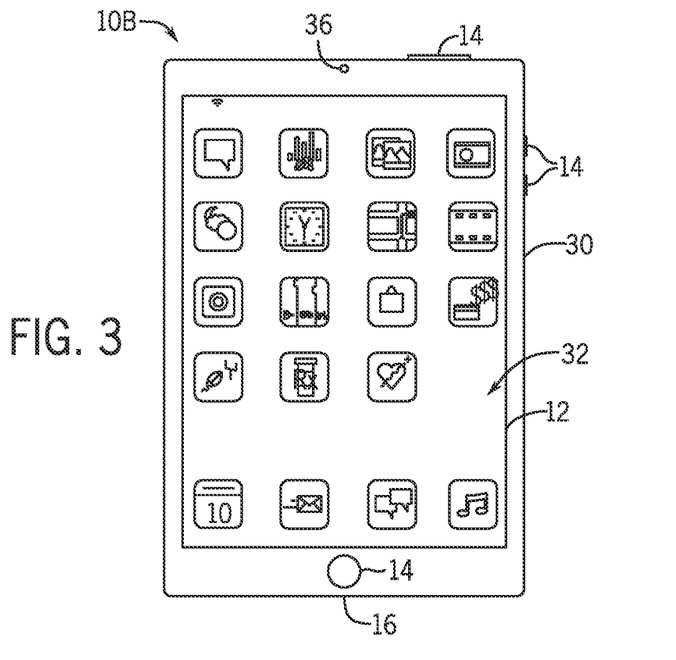
FIG. 3 is another example of the electronic device of FIG. 1, in accordance with an embodiment.
Figure 4:
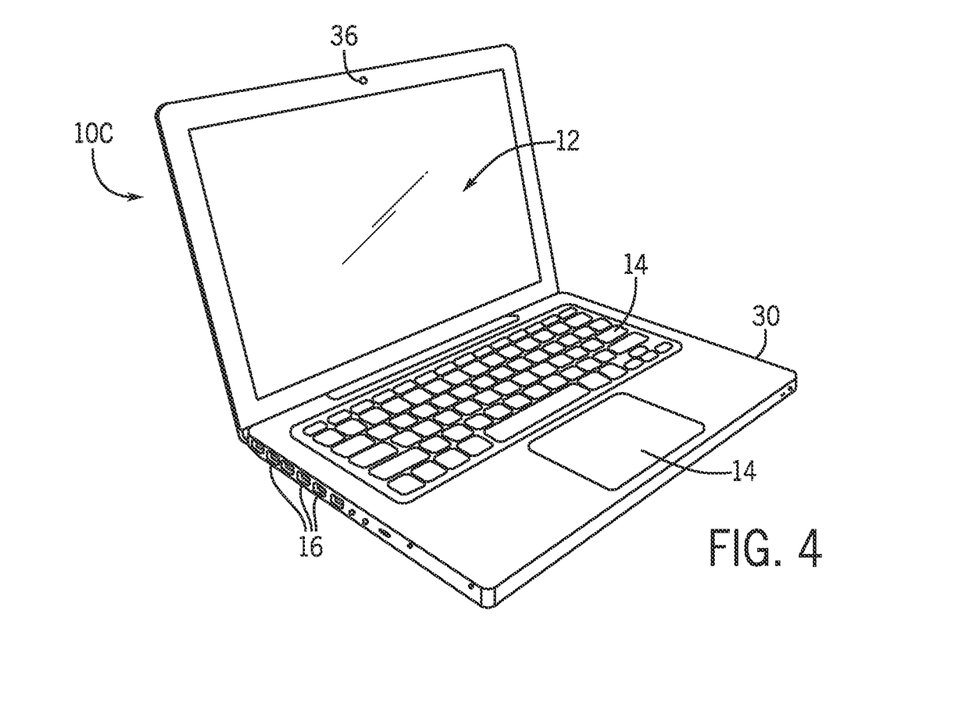
FIG. 4 is another example of the electronic device of FIG. 1, in accordance with an embodiment.
Figure 5:
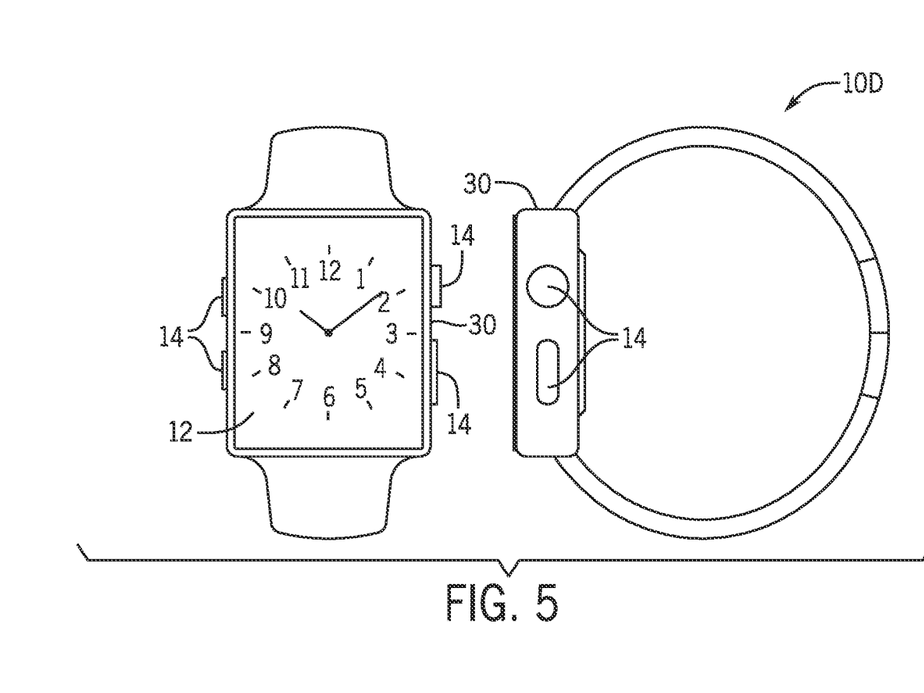
FIG. 5 is another example of the electronic device of FIG. 1, in accordance with an embodiment.

Another example of a suitable electronic device 10, specifically a tablet device 10B, is shown in FIG. 3. For illustrative purposes, the tablet device 10B may be an iPad® model available from Apple Inc. A further example of a suitable electronic device 10, specifically a computer 10C, is shown in FIG. 4. For illustrative purposes, the computer 10C may be a MacBook® or iMac® model available from Apple Inc. Another example of a suitable electronic device 10, specifically a watch 10D, is shown in FIG. 5. For illustrative purposes, the watch 10D may be an Apple Watch® model available from Apple Inc. As depicted, the tablet device 10B, the computer 10C, and the watch 10D each also includes an electronic display 12, input devices 14, I/O ports 16, and an enclosure 30.

Figure 6:
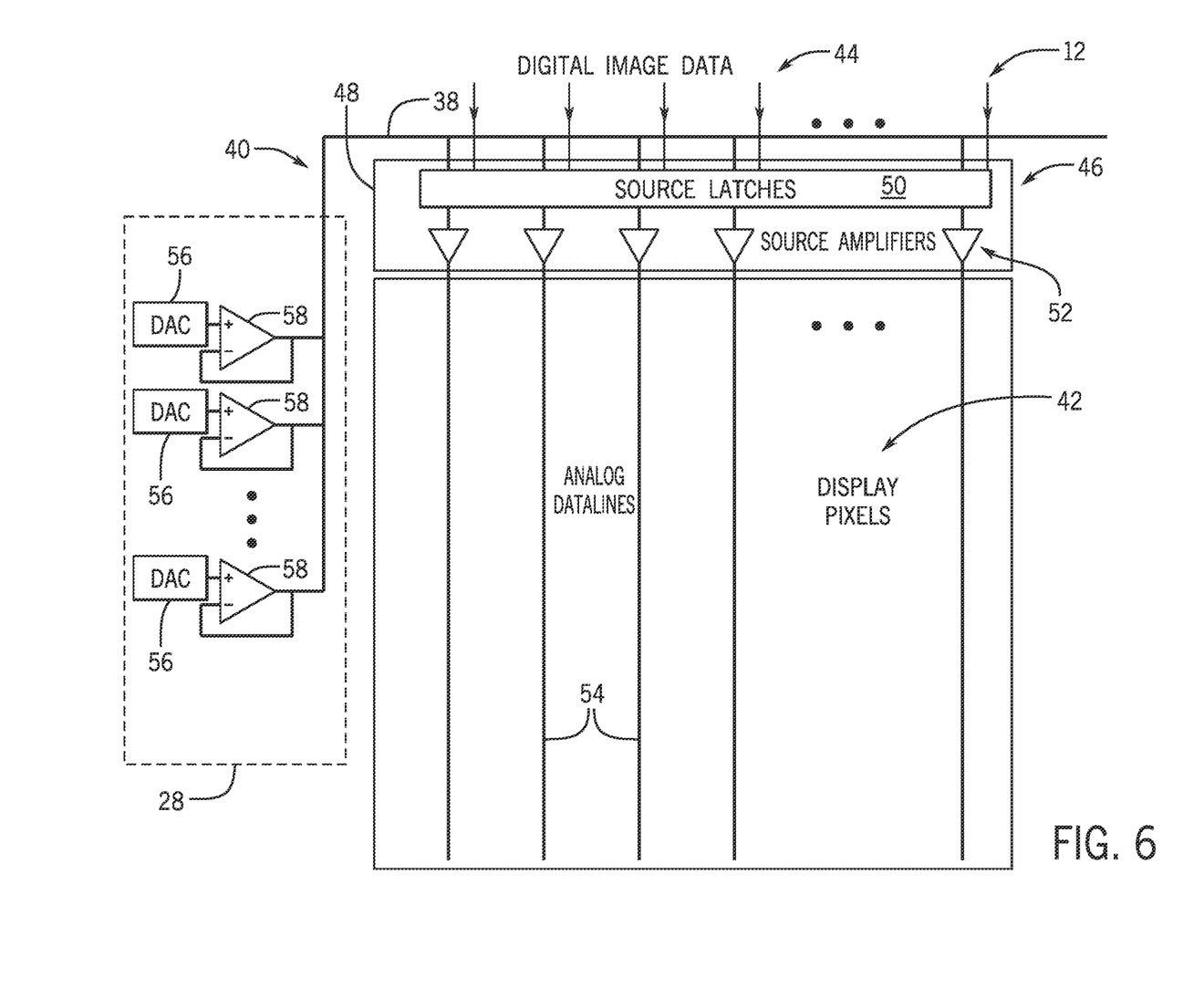
FIG. 6 is a schematic diagram of a gamma generator in electrical communication with an electronic display via a gamma bus, in accordance with an embodiment.

As described above, an electronic device 10 may use a gamma generator to provide a spectrum of analog voltages to the electronic display to facilitate illumination of the display pixels at target luminances. To help illustrate, a schematic diagram of a portion of the electronic device 10, including a gamma generator 28 and the electronic display 12 is shown in FIG. 6. As described in more detail below, the electronic device 10 may use one or more gamma generators 28 (e.g., a gamma generator 28 for each color component) and one or more respective gamma buses 38 for transmitting analog voltages 40 to an electronic display 12. A single gamma generator 28 with a single gamma bus 38 is discussed herein for brevity.

In some embodiments, the electronic display 12 may use analog voltages 40 to power display pixels 42 at various voltages that correspond to different luminance levels. For example, digital image data 44 may correspond to original or processed image data and contain target luminance values for each display pixel 42. As used herein, pixels or pixel data may refer to a grouping of sub-pixels (e.g., individual color component pixels such as red, green, and blue) or the sub-pixels themselves. Moreover, display circuitry 46 may include display drivers 48, also known as source drivers, data drivers, and/or column drivers, source latches 50, source amplifiers 52, and/or any other suitable logic/circuitry to use the appropriate analog voltage(s) 40, based on the digital image data 44. The display circuitry 46 may apply power at the corresponding voltage to the display pixel 42 to achieve the target luminance output from the display pixel 42. Such power, at the appropriate analog voltages 40 for each display pixel 42, may travel down analog datalines 54 to the display pixels 42. The different analog voltages 40 may be generated by the gamma generator 28 via one or more digital-to-analog converters (DACs) 56, amplifiers 58, and/or resistor strings (not shown).

As discussed above, the different analog voltages 40 supplied by the gamma bus 38 may correspond to at least a portion of the values of the digital image data 44. For example, 8-bit digital image data 44 per color component may correspond to 256 different gray levels and, therefore, 256 different analog voltages 40 per color component. Further, digital image data 44 corresponding to 8-bits per color component may yield millions or billions of color combinations as well as define the brightness of the electronic display 12 for a given frame. As should be appreciated, the digital image data 44 and corresponding voltage outputs may be associated with any suitable bit-depth depending on implementation and/or may use any suitable color space (e.g., RBG (red/blue/green), sRBG, Adobe RGB, HSV (hue/saturation/value), YUV (luma/chroma/chroma), Rec. 2020, etc.). Furthermore, the gamma bus 38 may include more or fewer analog voltages 40 than the corresponding bit-depth of digital image data 44. Indeed, in some embodiments, the same analog voltages 40 may be used for multiple gray levels, for example, via interpolation between analog voltages 40 and/or pulse-width modulated of current flow to obtain the different perceived luminance outputs. In some embodiments, the gamma generator 28 and/or display circuitry 46 may provide the display pixels with a negative voltage relative to a reference point (e.g., ground). As should be appreciated, the positive and negative voltages may be used in a similar manner to operate the display pixels 42, and they may have mirrored or different mappings between voltage level and target gray level.

Additionally, in some embodiments, different color components of display pixels 42 (e.g., a red sub-pixel, a green sub-pixel, a blue sub-pixel, etc.) may have different mappings between voltage level and target gray level. For example, display pixels 42 of different color components may have different luminance outputs given the same driving voltage/current. As such, in some embodiments, one or more gamma buses 38 may be used for each color component and/or voltage polarity. As should be appreciated, the mappings between voltage level and target gray level may depend on the type of display pixels (e.g., LCD, LED, OLED, etc.), a brightness setting, a color hue setting, temperature, contrast control, pixel aging, etc., and, therefore, may depend on implementation.

Figure 7:
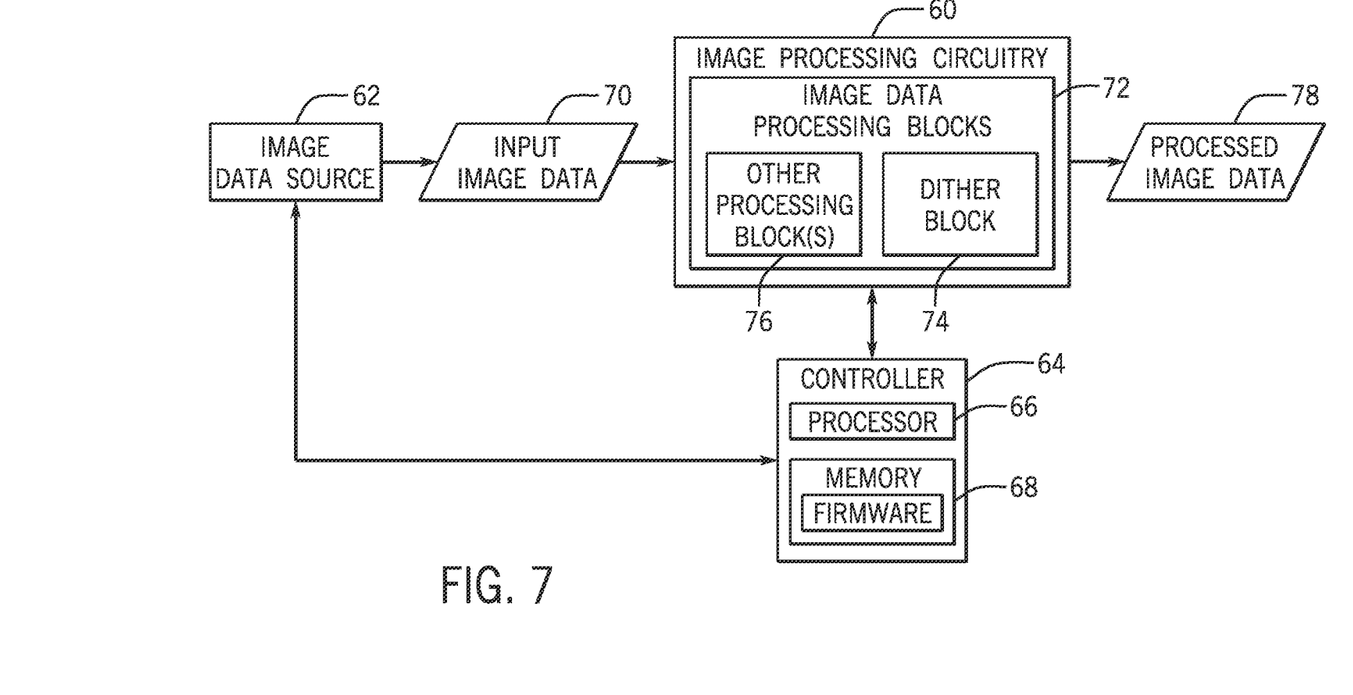
FIG. 7 is a block diagram of image processing circuitry, in accordance with an embodiment.

As described above, the electronic display 12 may display images based at least in part on digital image data 44. Before being used to display a corresponding image on the electronic display 12, image data may be processed by image processing circuitry 60, as shown in FIG. 7. In general, the image processing circuitry 60 may process the image data for display on one or more electronic displays 12. For example, the image processing circuitry 60 may include a display pipeline, memory-to-memory scaler and rotator (MSR) circuitry, warp compensation circuitry, or additional hardware or software means for processing image data. The image data may be processed by the image processing circuitry 60 to reduce or eliminate image artifacts, compensate for one or more different software or hardware related effects, and/or format the image data for display on one or more electronic displays 12. As should be appreciated, the present techniques may be implemented in standalone circuitry, software, and/or firmware, and may be considered a part of, separate from, and/or parallel with a display pipeline or MSR circuitry. In some embodiments, the image processing circuitry 60 may be implemented by circuitry in the electronic device 10, circuitry in the electronic display 12, or a combination thereof. For example, the image processing circuitry 60 may be included in the processor core complex 18, a timing controller (TCON) in the electronic display 12, or any combination thereof.

The electronic device 10 may also include an image data source 62 and/or a controller 64 in communication with the image processing circuitry 60. In some embodiments, the controller 64 may control operation of the image processing circuitry 60, the image data source 62, and/or the electronic display 12. To facilitate controlling operation, the controller 64 may include a controller processor 66 and/or controller memory 68. In some embodiments, the controller processor 66 may be included in the processor core complex 18, the image processing circuitry 60, a timing controller in the electronic display 12, a separate processing module, or any combination thereof and execute instructions stored in the controller memory 68 (e.g., firmware). Additionally, in some embodiments, the controller memory 68 may be included in the local memory 20, the main memory storage device 22, a separate tangible, non-transitory, computer-readable medium, or any combination thereof.

The image processing circuitry 60 may receive input image data 70 corresponding to a desired image to be displayed on the electronic display 12 from the image data source 62. The input image data 70 may indicate target characteristics (e.g., pixel data) corresponding to the desired image using any suitable source format. In some embodiments, the image data source 62 may be included in the processor core complex 18, the image processing circuitry 60, or a combination thereof. Furthermore, the input image data 70 may reside in a linear color space, a gamma-corrected color space, or any other suitable color space.

As described above, the image processing circuitry 60 may operate to process the input image data 70 received from the image data source 62. The image data source 62 may include captured images from cameras 36, images stored in memory (e.g., local memory 20 or main memory storage device 22), graphics generated or received by the processor core complex 18, or a combination thereof. The image processing circuitry 60 may include one or more sets of image data processing blocks 72 (e.g., circuitry, modules, or processing stages) such as a dither block 74. In general, the dither block 74 may alter input image data 70 spatially, temporally, or spatiotemporally to facilitate smoothing, shading, to increasing the number of perceivable colors (e.g., increase perceived resolution), and/or to facilitate compensating for quantization error due to a reduction in bit-depth. As an illustrative example, an electronic display 12 may not be able to produce the full color pallet of image data (e.g., input image data 70, processed image data 78, etc.). Instead of merely rounding or estimating to the nearest gray level, the dither block 74 may reduce the bit-depth and introduce noise on one or more least-significant bits to intertwine the gray codes of localized display pixels 42 (e.g., spatial dithering), intertwine the gray codes of a single display pixel 42 over multiple image frames (e.g., temporal dithering), or both. For example, a display pixel 42 may be blue in one image frame and red in the next. Thus, when the two image frames are rapidly displayed sequentially, a viewer's eye may perceive the display pixel 42 as purple. Additionally or alternatively, the dither block 74 may spatially dither image data to add color noise to facilitate reducing perceivable visual artifacts such as banding and/or flat areas. The dithering may approximate (e.g., over space, time, or both) the original image data, thereby providing a more aesthetic, clear, and/or sharp image for viewing.

As should be appreciated, multiple other processing blocks 76 may also be incorporated into the image processing circuitry 60, such as a color management block, a burn-in compensation (BIC) block, a scaling/rotation block, etc. The image data processing blocks 72 may receive and process the input image data 70 and processed image data 78. Further, the functions (e.g., operations) performed by the image processing circuitry 60 may be divided between various image data processing blocks 72, and while the term "block" is used herein, there may or may not be a logical separation between the image data processing blocks 72.

Figure 8:
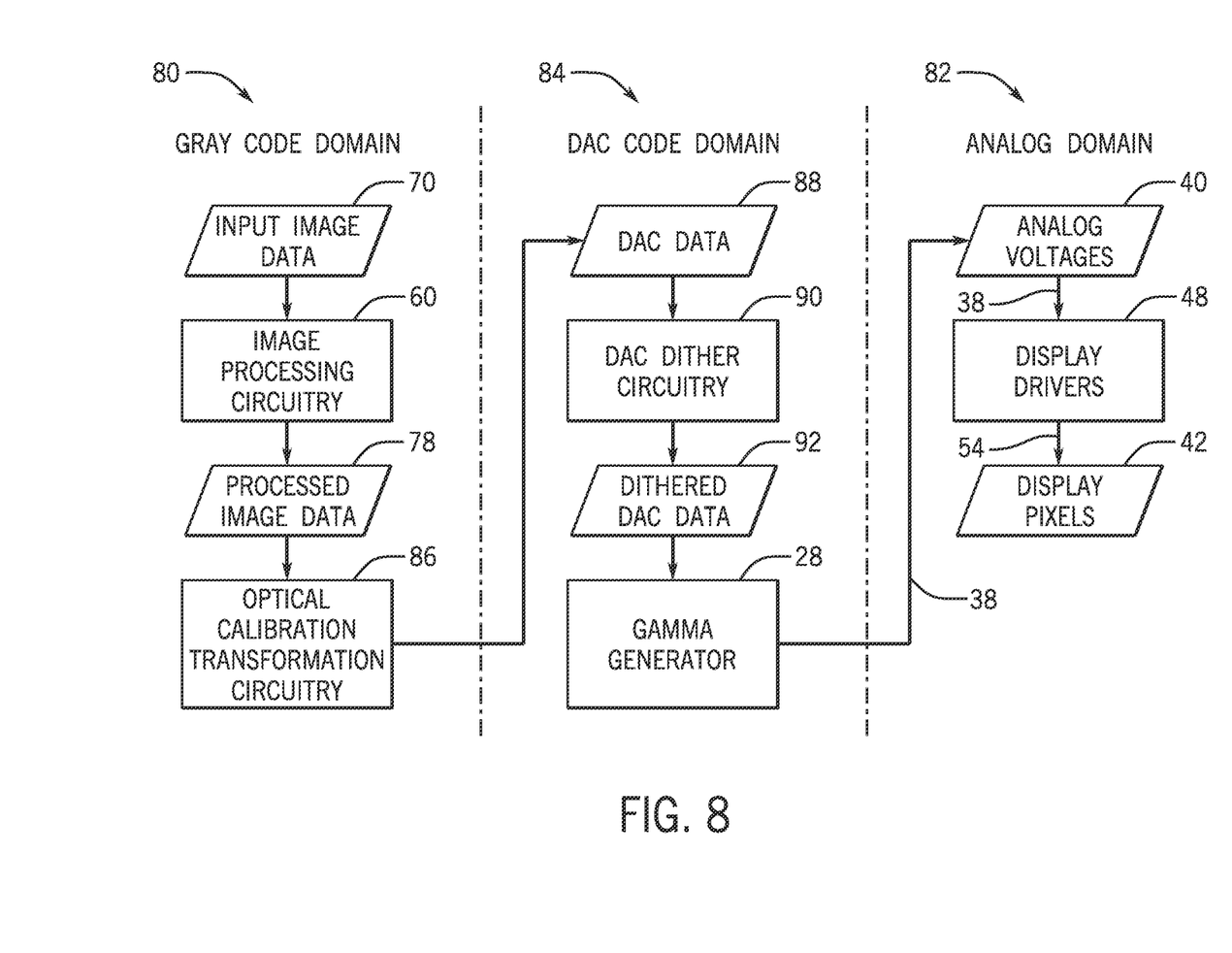
FIG. 8 is a block diagram of a flow of image data from image processing circuitry, through a gamma generator, and to display drivers, in accordance with an embodiment.

As stated above, current may be supplied to the display pixels 42 at various analog voltages 40 generated by the gamma generator 28 to achieve the desired luminance values (e.g., gray levels). In some scenarios, display pixels 42 of different electronic displays 12 may use different voltage levels/currents to output the same gray levels. As such, between image processing, executed in the gray code domain 80, and providing the analog voltages 40 to the electronic display 12, in the analog domain 82, the processed image data 78 may be transformed from a gray code format to a DAC code format, for use in a DAC code domain 84, as shown in FIG. 8. For example, optical calibration transformation circuitry 86 may use a look-up table (LUT) or stored algorithm to transform (e.g., upscale) the processed image data 78 to DAC data 88, having a DAC code format, to be used by one or more DACs in the gamma generator 28. Moreover, in some embodiments, the DAC code, and therefore the transformation by the optical calibration transformation circuitry 86, may be specific to the type and/or model of electronic display.

In general, the DAC data 88 may provide digital signals in DAC code such that the gamma generator 28 may generate the analog voltages 40 associated with the processed image data 78. In some embodiments, the optical calibration transformation circuitry 86 may increase the bit-depth (e.g., upscale) of the processed image data 78 to enhance resolution. For example, the enhanced resolution may provide increased granularity to the DAC data 88 for the gamma generator 28 and subsequently the analog voltages 40 to enable use of more sensitive electronic displays 12. Such sensitivity in the electronic display 12 may include tighter tolerances between analog voltages of successive luminance levels and associated gray levels. In some embodiments, additional data processing may occur in the DAC code domain 84.

In some scenarios, the processed image data 78 and/or DAC data 88 may have a higher resolution (e.g., bit-depth) than the input of the gamma generator 28. As such, DAC dither circuitry 90 may dither the DAC data 88 in the DAC code domain 84 prior to the gamma generator 28 to reduce the bit-depth into the gamma generator 28, but maintain effective resolution. For example, in a similar manner as the dither block 74, discussed above, the DAC dither circuitry 90 may dither the DAC data 88 spatially, temporally, or spatiotemporally to generate dithered DAC data 92. However, whereas the dither block 74 operates in the gray code domain 80 to enhance the effective resolution of the electronic display 12 and/or for error diffusion, the DAC dither circuitry 90 operates in the DAC code domain 84 to enhance the effective resolution of the gamma generator 28 or the DACs 56 thereof. As should be appreciated, the DAC dither circuitry 90 may also support error diffusion within the DAC code domain 84. In some embodiments, the DAC dither circuitry 90 may be disposed directly before the gamma generator 28 (e.g., without other processing in-between). Additionally, as DAC dither circuitry 90 may be implemented in standalone circuitry, software, and/or firmware and/or may be combined with additional processing techniques within the DAC code domain 84.

In some embodiments, the DAC dither circuitry 90 may select a type of dithering operation (e.g., spatial, temporal, or spatiotemporal) based on an operating mode of the electronic device 10 or the electronic display 12. For example, for variable frame rate displays or operating modes, the DAC dither circuitry 90 may implement spatial dithering or spatiotemporal dithering, as the temporal aspect of the frame rate may be unknown or variable. Additionally or alternatively, for static or known frame rates (e.g., refresh rates), the DAC dither circuitry 90 may implement spatial, temporal, or spatiotemporal dithering.

Figure 9:
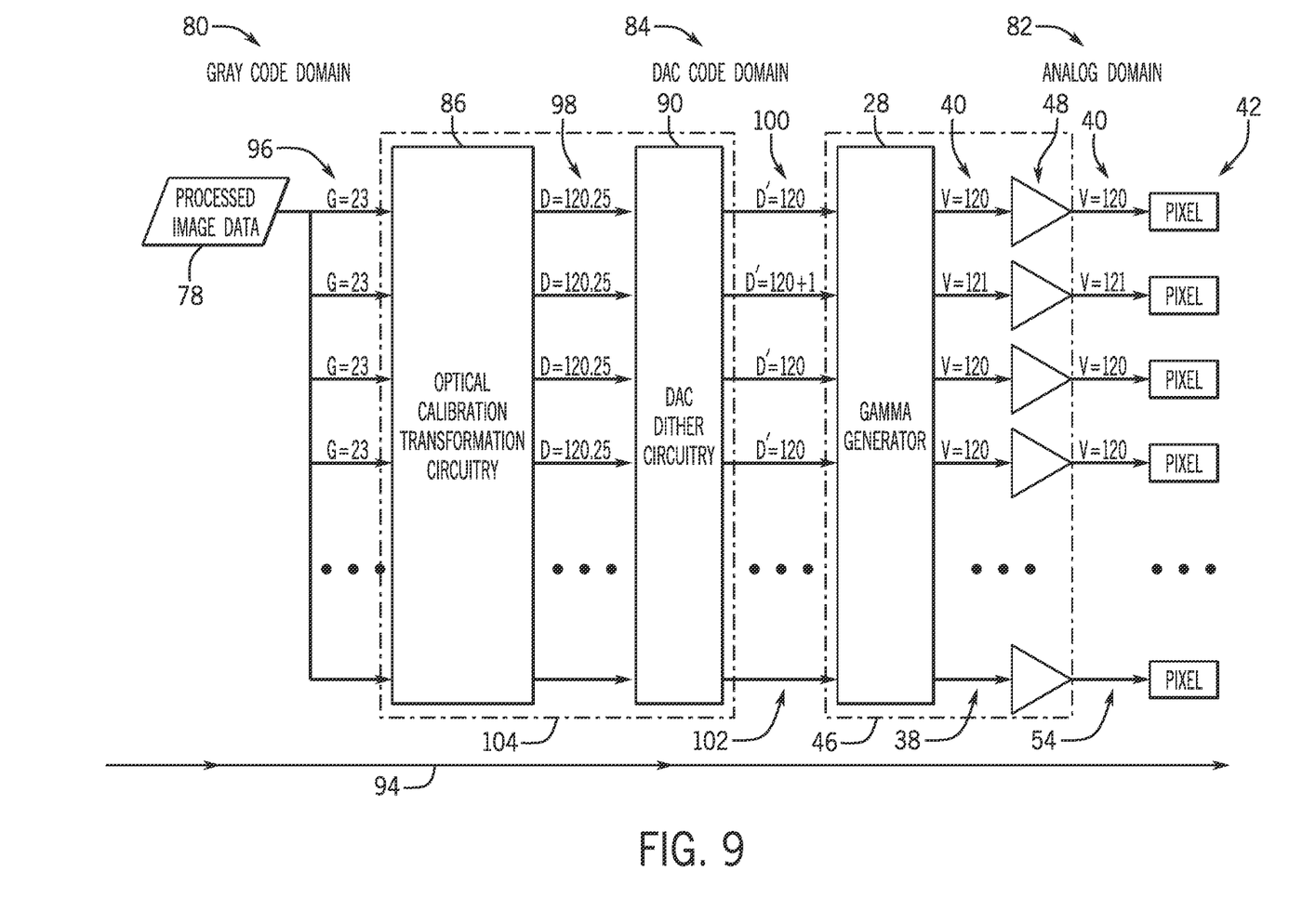
FIG. 9 is a schematic diagram of a portion of the flow of image data of FIG. 8 incorporating spatial dithering, in accordance with an embodiment.
Figure 10:
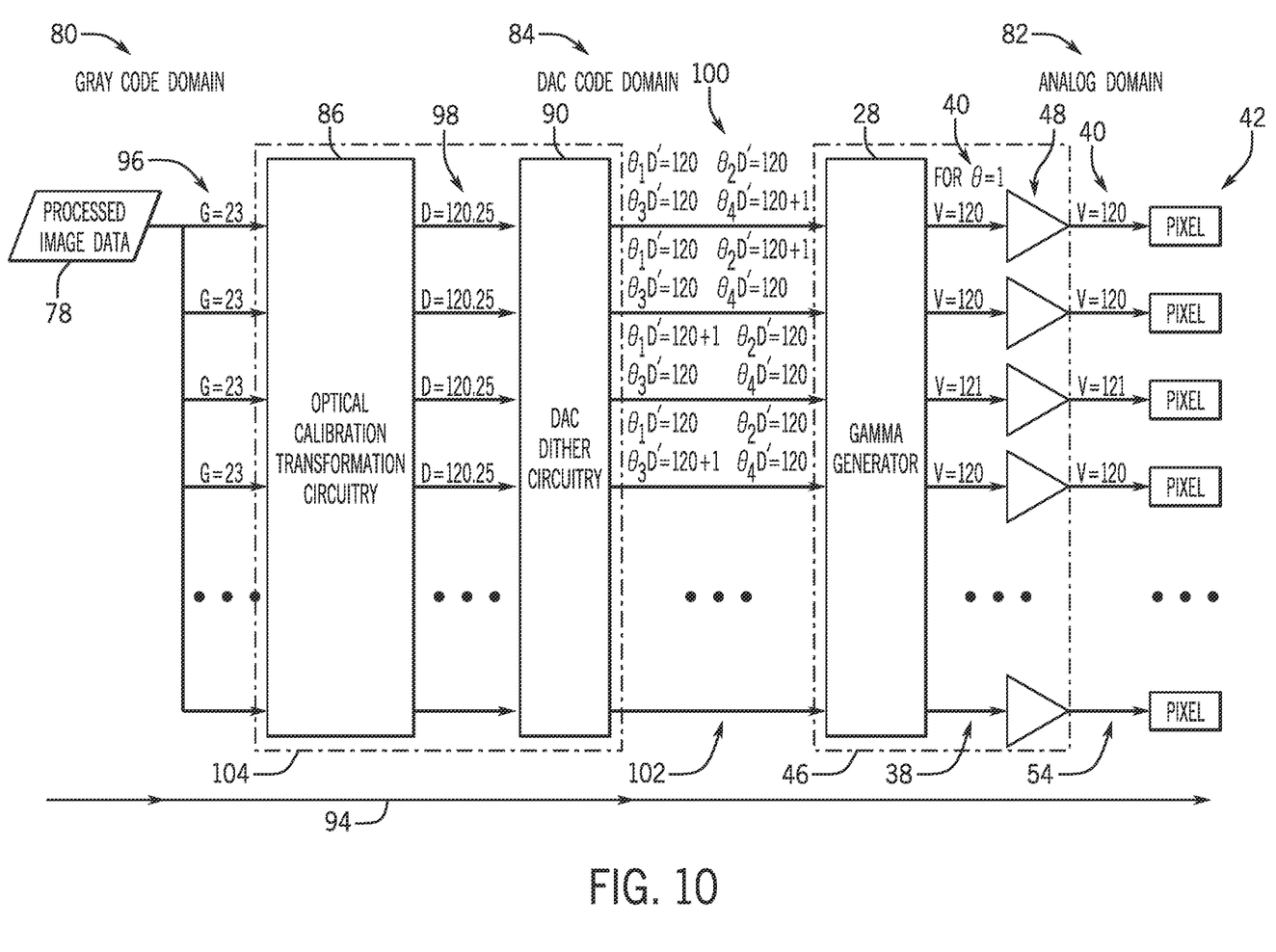
FIG. 10 is a schematic diagram of a portion of the flow of image data of FIG. 8 incorporating spatiotemporal dithering, in accordance with an embodiment.

To help illustrate, FIGS. 9 and 10 are schematic diagrams of a flow 94 of processed image data 78 from the gray code domain 80, through the DAC code domain, and to the display pixels 42 in the analog domain 82, while incorporating spatial dithering and spatiotemporal dithering, respectively. In the depicted embodiment of FIG. 9, the processed image data 78 indicates a gray code value 96 (e.g., G=23) for four display pixels 42. The optical calibration transformation circuitry 86 may transform the gray code values 96 into equivalent DAC code values 98 (e.g., D=120.25) of the DAC data 88. However, the gamma generator 28 may be unable to directly manipulate intermediate DAC code values 98, such as D=120.25. Although shown as a decimal value, as should be appreciated, the DAC code values 98 shown are indicative of values between those directly manageable by the gamma generator 28 and may or may not be represented as decimal values, depending on implementation. As such, the DAC dither circuitry 90 may spatially dither the DAC code values 98 to generate dithered DAC code values 100 (e.g., D'=120 and D'=121) of the dithered DAC data 92. When implementing spatial dithering, the DAC dither circuitry 90 may provide dithered DAC code values 100 that the gamma generator 28 can manage and that spatially average (e.g., over the pixel locations) to the non-dithered DAC code values 98. The dithered DAC code values 100 may then be used by the gamma generator 28 to generate the analog voltages 40 that are sent to the display pixels 42 via the display drivers 48.

Similarly, when implementing spatiotemporal dithering, as in FIG. 10, the DAC dither circuitry 90 may provide dithered DAC code values 100 that the gamma generator 28 can manage and that spatially average (e.g., over the pixel locations) to the non-dithered DAC code values 98. However, which of display pixels 42 receives an increased dithered DAC code value 100 may change depending on a phase, $\theta$. For example, when $\theta=1$, the third pixel of the group of four pixels may receive the increased dithered DAC code value 100, whereas when $\theta=2$, the second pixel of the group may receive the increased dithered DAC value 100. The phase may change for each image frame or at a particular frequency (e.g., after a set amount of time). Additionally or alternatively, the DAC dither circuitry 90 may dither the DAC code values 98 individually over time (e.g., temporally). Using the same example as in FIGS. 9 and 10, temporal dithering of a DAC code value 98 of D=120.25 for an individual display pixel 42 may yield a dithered DAC code value 100 of D'=120 for ¾ of a given time and D'=121 for ¼ of the given time regardless of other pixel values. As should be appreciated, the number of and/or relationships between gray levels and the DAC code or analog voltage equivalents may depend on implementation. Moreover, the values of FIGS. 9 and 10 are given as examples and are non-limiting. Furthermore, as discussed herein, the image data (e.g., processed image data 78, digital image data 44, input image data 70, DAC data 88, and/or dithered DAC data 92 and their corresponding analog voltages 40 may be associated with any suitable bit-depth and gray level values depending on implementation and the electronic display 12.

By dithering the DAC data 88 in the DAC code domain 84 the effective resolution of the gamma generator 28 may be increased. As such, a gamma generator 28 having a reduced working bit-depth, relative to the DAC data 88, may be used while maintaining the higher perceived (e.g., effective) resolution. While, implementing a lower bit-depth gamma generator 28 may decrease the footprint within the electronic device 10, reducing the bit-depth of the DAC data 88 (e.g., to that of dithered DAC data 92) may also decrease the footprint of the data lines (e.g., gamma bus 38) carrying the dithered DAC data 92 and/or analog voltages 40, further saving space and/or manufacturing resources. For example, in some embodiments, the gamma generator 28 may be disposed with or near the display circuitry 46, having a bus 102 from the timing controller (TCON) 104. The decreased bit-depth of the dithered DAC data 92 may allow for decreased bandwidth usage amongst the bus 102, the gamma bus 38, and/or other data lines. As should be appreciated, the disposition of circuits may be based on implementation, and the illustrated groupings circuitry and buses are shown as non-limiting examples.

Figure 11:
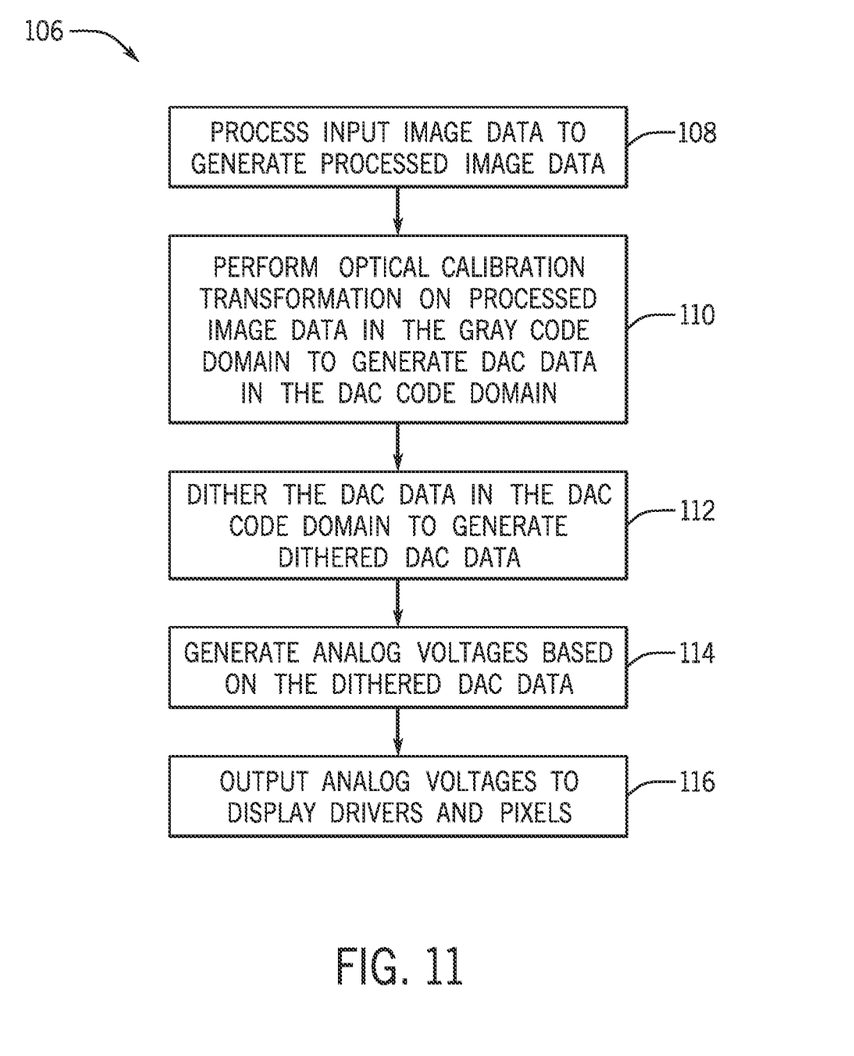
FIG. 11 is a flowchart of an example process for dithering DAC data in a DAC code domain, in accordance with an embodiment.

FIG. 11 is a flowchart of an example process 106 for dithering DAC data 88 in a DAC code domain 84. Input image data 70 may be processed (e.g., via image processing circuitry 60) to generate processed image data 78 (process block 108). Additionally, an optical calibration transformation may be performed (e.g., via optical calibration transformation circuitry 86) in the gray code domain 80 on the processed image data 78 to generate DAC data 88 in the DAC code domain 84 (process block 110). DAC dither circuitry 90 may dither the DAC data 88 in the DAC code domain 84 to generate dithered DAC data 92 (process block 112). Additionally, the gamma generator 28 may generate analog voltages 40 based on the dithered DAC data 92 (process block 114). The analog voltages 40, in the analog domain 82, may then be output to the display drivers 48 and display pixels 42 (process block 116).

Although the above referenced flowchart is shown in a given order, in certain embodiments, process blocks may be reordered, altered, merged, deleted, and/or occur simultaneously. Additionally, the referenced flowchart is given as an illustrative tool and further decision and process blocks may also be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
   an electronic display comprising a plurality of display pixels configured to display an image based at least in part on a plurality of analog voltage signals;
   optical calibration circuitry configured to generate digital-to-analog converter (DAC) data based at least in part on image data associated with the image;
   dither circuitry configured to reduce a bit-depth of the DAC data, generating dithered DAC data; and
   a gamma generator comprising one or more DACs configured to generate the analog voltage signals based at least in part on the dithered DAC data, wherein the dithered DAC data is configured to instruct the gamma generator to generate the plurality of analog voltage signals indicative of the image data, wherein the gamma generator is physically separated from the dither circuitry by a data bus, and wherein the data bus is configured to transmit the dithered DAC data to the gamma generator at the reduced bit-depth.

2. The electronic device of claim 1, wherein the optical calibration circuitry is configured to generate the DAC data by transforming the image data from a gray code domain to a DAC code domain, wherein the gamma generator is configured to operate in the DAC code domain.

3. The electronic device of claim 1, wherein the image data comprises processed image data, the electronic device comprising image processing circuitry configured to generate the processed image data based at least in part on input image data.

4. The electronic device of claim 3, wherein the image processing circuitry comprises a dither block configured to dither the input image data.

5. The electronic device of claim 3, wherein the image processing circuitry is configured to process the input image data and generate the processed image data in a gray code domain, wherein the gamma generator is configured to operate in a DAC code domain.

6. The electronic device of claim 1, wherein the dither circuitry is configured to spatially dither or spatiotemporally dither the DAC data.

7. The electronic device of claim 1, wherein the optical calibration circuitry comprises a look-up table (LUT) configured to map the image data to the DAC data.

8. The electronic device of claim 1, wherein the dither circuitry is configured to reduce the bit-depth of the DAC data directly prior to the gamma generator.

9. The electronic device of claim 1, wherein generating the DAC data based at least in part on the image data comprises mapping the image data from a gray code domain to a DAC code domain and increasing a bit-depth of the image data to the bit-depth of the DAC data.

10. A method comprising:
    processing, via image processing circuitry, input image data in a gray code domain to generate processed image data;
    transforming, via optical calibration circuitry, the processed image data in the gray code domain to a digitalto-analog converter (DAC) code domain to generate DAC data, wherein transforming the processed image data comprises upscaling the processed image data, increasing a bit-depth of the processed image data;

dithering, via dither circuitry, the DAC data in the DAC code domain to generate dithered DAC data;

converting, via a DAC, the dithered DAC data in the DAC code domain to an analog voltage in an analog domain; and outputting, the analog voltage to an electronic display in the analog domain.

11. The method of claim 10, wherein dithering the DAC data comprises temporally dithering or spatiotemporally dithering the DAC data.

12. The method of claim 10, wherein the image processing circuitry comprises second dither circuitry configured to dither the input image data in the gray code domain.

13. The method of claim 10, wherein transforming the processed image data comprises mapping the processed image data from the gray code domain to the DAC code domain via a look-up table (LUT).

14. The method of claim 13, wherein the LUT is configured to upscale the processed image data.

15. The method of claim 10, comprising selecting a dither mode of the dither circuitry based at least in part on an operating mode of the electronic display.

16. An electronic display comprising:
a plurality of pixels;
one or more display drivers configured to drive analog voltages to the plurality of pixels;
a gamma generator configured to generate the analog voltages based at least in part on dithered digital-to-analog converter (DAC) data in a DAC code format; and
circuitry configured to:
transform image data from a gray code format to the DAC code format, generating DAC data, based at least in part on an optical calibration mapping;
dither the DAC data in the DAC code format to generate dithered DAC data at a reduced bit-depth in the DAC code format; and
output the dithered DAC data in the DAC code format to the gamma generator, wherein the gamma generator is physically separated from the circuitry by a data bus, wherein the data bus is configured to transmit the dithered DAC data to the gamma generator at the reduced bit-depth.

17. The electronic display of claim 16, wherein the DAC code format of the DAC data or the dithered DAC data is associated with a type of the gamma generator.

18. The electronic display of claim 16, wherein the optical calibration mapping comprises a mapping algorithm.

19. The electronic display of claim 16, wherein the circuitry is configured to receive the image data in the gray code format from image processing circuitry.

20. The electronic display of claim 16, wherein the dithered DAC data is not altered between dithering and outputting of the dithered DAC data to the gamma generator.

* * * * *